United States Patent [19]
Schroeder

[11] 3,958,136
[45] May 18, 1976

[54] LEVEL SHIFTER CIRCUIT

[75] Inventor: Paul Robert Schroeder, Wescosville, Pa.

[73] Assignee: Bell Telephone Laboratories, Incorporated, Murray Hill, N.J.

[22] Filed: Aug. 9, 1974

[21] Appl. No.: 496,148

[52] U.S. Cl. .............................. 307/254; 307/214; 307/260; 307/270; 307/300
[51] Int. Cl.² ........................................ H03K 17/00
[58] Field of Search .......... 307/254, 260, 300, 270, 307/214, 218, 215, DIG. 1

[56] References Cited
UNITED STATES PATENTS

| | | | |
|---|---|---|---|
| 3,364,281 | 2/1971 | Tokunaso et al. .................. | 307/214 |
| 3,789,241 | 1/1974 | Hess, Jr. ............................. | 307/300 |
| 3,824,408 | 7/1974 | Brunel ................................ | 307/214 |

*Primary Examiner*—Stanley D. Miller, Jr.
*Assistant Examiner*—B. P. Davis
*Attorney, Agent, or Firm*—I. Ostroff; A. J. Torsiglieri

[57] ABSTRACT

An improved TTL to MOS voltage level shifter circuit utilizes a totem pole output stage consisting of a pull-up junction transistor and a pull-down saturation junction transistor, an intermediate stage consisting essentially of a saturation junction transistor, an input stage consisting essentially of a diode and a saturation junction transistor, and current spike inhibit circuitry which consists essentially of a saturation junction transistor connected between the input stage and the base of the pull-down transistor. The current spike inhibit transistor, which turns on with the pull-down transistor, has a greater turnoff time than the pull-down transistor and consequently provides a relativley low impedance discharge path connected to the base of the pull-down transistor which allows the pull-down transistor to turn off before the pull-up transistor turns on. This helps insure against output current spikes that occur if the pull-up and pull-down transistors conduct simultaneously.

5 Claims, 3 Drawing Figures

LEVEL SHIFTER CIRCUIT

BACKGROUND OF THE INVENTION

This invention relates to voltage pulse amplifiers and, in particular, to an amplifier which is well-suited to serve as a TTL-to-MOS level shifter.

Many of today's computer logic circuits are of the junction transistor TTL configuration while many of the random access memory arrays are fabricated with MOS transistors. There is an obvious need for level shifter amplifiers to convert TTL voltage logic levels to MOS voltage logic levels. One commercially available TTL-to-MOS level shifter utilizes a totem pole output stage which consists of a pull-up and a saturation pull-down junction transistor. One of the problems with this type of configuration is that minority carrier storage which occurs when the pull-down transistor is operated in saturation causes both transistors to conduct simultaneously during switching. This provides a direct path between the power supply utilized and ground potential which results in undesirable relatively large current spikes in the output stage.

Various suggestions have been made to alleviate output current spiking in the above configuration. The inclusion of a series resistance in the collector of the pull-up transistor does not eliminate the problem but merely limits its severity. In the application of a MOS level shifter where high capacitive loads and relatively large voltage swings are involved, a series resistor significantly degrades response time. Another solution is the use of a Schottky barrier clamp diode across the collector base junction of the pull-down transistor. This solution is likewise undesirable since it adds significant capacitive loading which also significantly degrades response time. An economically viable solution to this problem requires the addition of few circuit elements which do not require much silicon area for implementation and do not significantly increase circuit power dissipation or degrade response time.

OBJECTS OF THE INVENTION

It is an object of this invention to provide level shifter circuitry which utilizes a pull-up and a saturation pull-down output transistor stage in which simultaneous conduction by both transistors is essentially eliminated without any significant degradation in response time, or significant increase in circuit power dissipation or circuit complexity.

SUMMARY OF THE INVENTION

This and other objects of the invention are attained in the illustrative embodiment thereof comprising a level shifter circuit comprising an output stage having the series combination of a first pull-up switching device and a first pull-down saturation junction transistor, an intermediate stage comprising essentially a second saturation junction transistor which is coupled by the emitter to the base of the first saturation transistor and by the collector to the control terminal of the first switching device, an input stage, and a current spike inhibit stage comprising essentially a third saturation junction transistor in which the base is coupled to the input stage and the collector is coupled to the base of the pull-down transistor.

A high logic-level signal applied to the input stage causes the first pull-down, second intermediate stage, and third current spike inhibit stage saturation transistors to conduct and inhibits conduction in the first pull-up switching device. Any load capacitance coupled to the collector of the pull-down transistor is discharged. After the load capacitance has been discharged, the input level can be pulsed to the logic-level. This causes the intermediate stage second transistor to turn off after excess minority carriers stored within the base thereof are dissipated. The current spike inhibit third transistor continues to conduct because of excess minority carriers stored within the base thereof, and therefore it serves as a discharge path which allows excess minority carriers stored within the base of the first pull-down transistor to be discharged at the same time that the second intermediate stage transistor is turning off. This insures that the first pull-down transistor turns off at a point in time no later than the time the second intermediate stage transistor turns off. When the second transistor turns off, the first switching means is turned on and conduction occurs therethrough which charges the capacitive load to essentially the value of a power supply coupled to the first switching means. The input signal can then once again return to the high level.

In the preferred embodiment TTL input signal levels are applied to the input stage and MOS output levels are generated.

This and other objects, features and advantages of the invention will be better understood from a consideration of the following detailed description taken in conjunction with the accompanying drawing.

DETAILED DESCRIPTION

Figure 1:
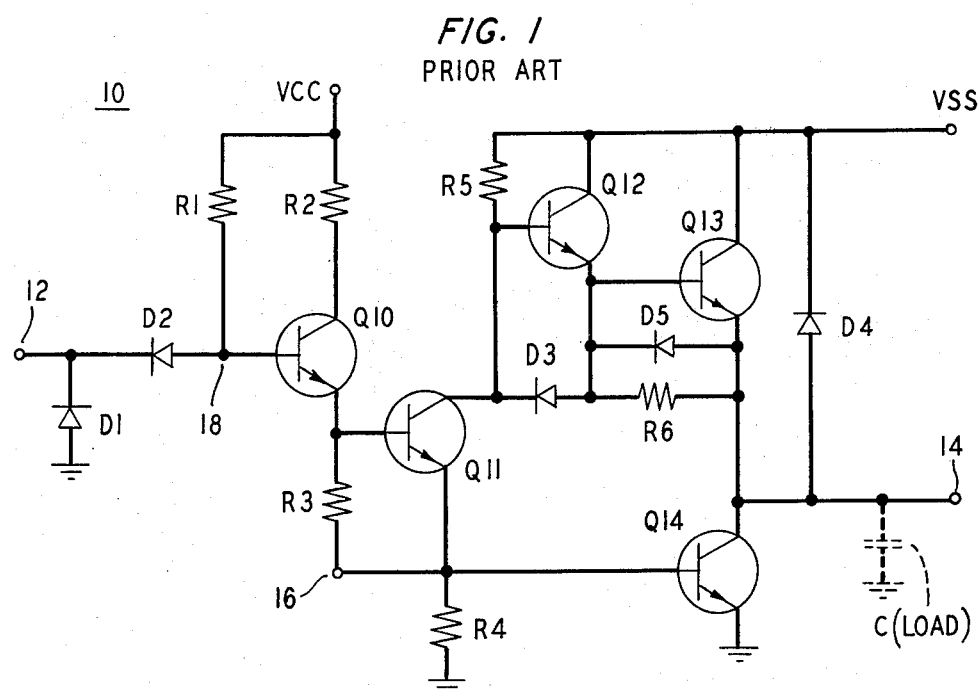
FIG. 1 illustrates a prior art level shifter circuit.

Referring now to FIG. 1 there is illustrated a prior art level shifter circuit 10 which is adapted to accept TTL voltage levels at input terminal 12 and to produces MOS voltage levels at output terminal 14.

THe cathode of a diode D2 is coupled to input terminal 12. The anode of D2 is coupled to one terminal of a resistor R1, node 18, and the base of a saturation junction transistor Q10. The collector of Q10 is connected to one terminal of a resistor R2, the emitter is connected to the base of a saturation junction transistor Q11, and to the first terminal of a resistor R3. The second terminals of R1 and R2 are both connected to a power supply VCC. The collector of Q11 is connected to the cathode of a diode D3, the base of a transistor Q12, and the first terminal of a resistor R5. The emitter of Q11 is connected to the second terminal of R3, node 16, the first terminal of a resistor R4, and the base of a saturation pull-down junction transistor Q14. The second terminal of R4 and the emitter of Q14 are both connected to a reference potential which is typically, as illustrated, ground potential.

The emitter of Q12 is coupled to the base of a pull-up transistor Q13, the cathode of a diode D5, the first terminal of a resistor R6, and the anode of D3. Power supply VSS is connected to the collectors of Q12 and Q13 amd the second terminal of R5. The emitter of Q13 is connected to the anode of D5, the second terminal of R6, the collector of Q14 and output terminal 14. The dashed-line capacitor (illustrated as C (load)) represents a load capacitance connected to terminal 14.

The cathodes of diodes D1 and D4 are connected to terminal 12 and VSS, respectively. The anodes of D1 and D4 are connected to ground potential and terminal 14, respectively. D1 serves to prevent terminal 12 from being pulled down in potential much below ground potential and D4 prevents terminal 14 from going much above the potential of VSS.

If we assume that TTL input voltage levels are +0.4 volt and 2.4 volts and that MOS voltage levels are +0.4 volts and +15 volts, then VCC and VSS are +5 and +16 volts, respectively.

Assuming the input voltage applied to terminal 12 is +2.4 volts then D2 cannot be forward-biased and conduct since the anode thereof can go no higher in potential than approximately +2.1 volts since the emitter base junctions of Q10, Q11 and Q14 serve to clamp node 18. With this input signal level, current flows from VCC through R1 and consequently Q10 is biased on and operates in saturation. A transistor denoted as a saturation junction transistor is a junction transistor which is operated in a saturation mode. A transistor is said to operate in saturation when the potential of the collector is less positive than that of the base and, consequently, the collector base junction is forward biased sufficiently to allow substantial current flow. This saturation operation causes minority carriers to be stored within the transistor which must be discharged or allowed to recombine with majority carriers before the transistor can be turned off.

As Q10 conducts it biases Q11 and consequently Q14 such that they both conduct and operate in saturation. Conduction through Q11 drops the potential at the base of Q12 such that Q12 and Q13 cannot conduct at this point in time. Assuming that the load capacitor is initially charged to a potential of approximately +15 volts, it discharges through conducting Q14 to within a few tenths of a volts of ground potential. In addition, it discharges through the combination of R6, D5, D3 and Q11 into the base of Q14. One of the purposes of D3, D5 and R6 is to provide additional base current to transistor Q14 in order to allow the rapid discharge of a load capacitance.

After the load capacitance has been discharged to close to ground potential, the input signal applied to terminal 12 can then be switched to the low level (~ + 0.4 volt). This tends to cause D2 to be forward-biased which biases Q10 off. Q10 does not, however, turn off until all excess stored minority carriers are discharged or otherwise dissipated. This in turn causes Q11 and Q14 to turn off after minority carriers have been removed from the respective bases. Accordingly, the collector of Q11 rises in potential to essentially that of VSS, and consequently the emitter base junctions of Q12 and Q13 are forward-biased and Q12 and Q13 turn on. This causes the capacitive load to charge up to a value close to the potential of VSS. At this point in time the input voltage can once again be returned to the high level (+2.4 volts) and the process can be repeated.

One of the problems associated with circuit 10 is that Q11 turns off significantly before Q14. Thus Q13 can and does turn on before Q14 turns off. This establishes a direct path between VSS and ground potential that allows a large undesirable current spike to occur through Q13 and Q14.

Various methods are known for decreasing time required to turn off a transistor which has been operated in saturation. One remedy is the inclusion of a Schottky barrier diode across the collector base junction of the transistor. The Schottky barrier diode turns on prior to the time the collector base junction is sufficiently forward-biased to substantially conduct and, accordingly, does not allow the transistor to operate in saturation. Therefore, minority carrier storage is greatly reduced or eliminated and the transistor is relatively easily turned off. One undesirable aspect which occurs with the use of a Schottky barrier diode is that the effective capacitive load at the collector is significantly increased due to the Miller effect which causes the Schottky barrier diode capacitance to appear as beta (the current gain of the transistor) times larger than it actually is. This added capacitance reduces response time and is therefore undesirable.

Another solution to the problem is to significantly reduce the value of R4. This provides a lower impedance discharge path for minority carriers stored in the base of Q14 and thus permits the more rapid discharge thereof. This allows the transistor to be turned off more quickly than previously. However, a lowering of the value of R4 significantly below the value of R3 causes a degradation in circuit noise margin.

As the input signal at terminal 12 is pulsed to the high TTL signal level (approximately +2.4 volts), Q10 turns on, and consequently the potential of the base of Q11 starts to rise. Q11 and Q14 should have insufficient forward-bias across the respective emitter base junctions to permit conduction through both until the base potential reaches approximately +1.4 volts. This +1.4 volts is the threshold voltage for TTL logic signals. If R3 and R4 are close in value, then as the potential of the base of Q11 rises, the potentials across the two respective emitter base junctions of Q11 and Q14 remain essentially equal and increase at the same rate. This insures that Q11 and Q14 both conduct when the base potential of Q11 reaches +1.4 volts and that neither transistor conducts prior thereto. Therefore, in order to maintain proper noise margin if R4 is reduced in value, R3 should be likewise reduced. Reducing the values of R3 and R4 has the disadvantage of significantly increasing power dissipation and does not completely eliminate the problem of Q13 and Q14 conducting simultaneously, but merely limits the duration of such conduction.

Another solution to the problem of current spiking in Q13 and Q14 is the inclusion of a series resistor in the collector of Q13. This helps minimize the amplitude of current spiking. However, it also sugnificantly degrades the response time and is therefore undesirable.

Figure 2:
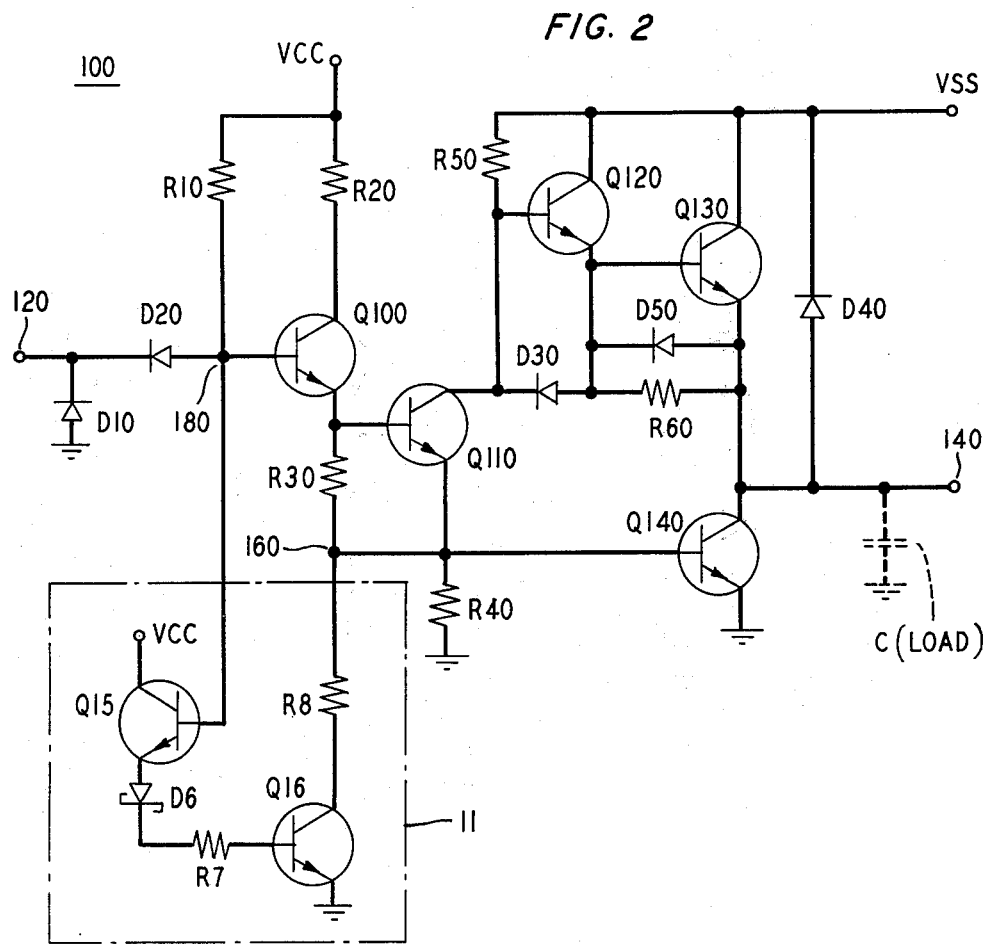
FIG. 2 illustrates an improved level shifter circuit in accordance with one embodiment of the present invention.

Referring now to FIG. 2 there is illustrated an improved level shifter circuit 100. This configuration is identical to the configuration of FIG. 1 except for the circuitry illustrated in dashed-line rectangle 11. The nomenclature associated with a component in FIG. 2 that corresponds to a component of FIG. 1 is denoted by the same reference label with the addition of a zero. For example, transistor Q10 of FIG. 1 corresponds to transistor Q100 of FIG. 2.

The base of a junction transistor Q15 is coupled to node 180 and the emitter is coupled to the anode of a Schottky barrier diode D6. The collector of Q15 is coupled to VCC. The anode of D6 is coupled to the first terminal of a resistor R7 which is coupled by the second terminal to the base of a junction saturation transistor Q16. The emitter of Q16 is coupled to ground potential and the collector is coupled to the first terminal of a resistor R8. The second terminal of R8 is coupled to node 160 (the base of Q140).

When input terminal 120 is at a high level (+2.4 volts), Q100, Q110 and Q140 conduct and operate in saturation. This in turn discharges the dashed-line load capacitance coupled to output terminal 140. While these three transistors are operating in saturation, Q15 is on and as such provides base current through D6 and R7 to the base of Q16. Q15, besides serving as a supply of base current for Q16, provides a high input impedance which does not load down node 180. D6 serves as a level shifting diode which insures that Q16 turns on at essentially the same potential as Q100, Q110 and Q140. Q16 is therefore also on at this point in time and operates in saturation. R7 serves to limit the base drive current to Q16. Accordingly, some of the base current which would normally flow into Q140 is siphoned off through R8 and Q16.

Now, assume the load capacitance has been completely discharged. The input voltage can now return to the low level ($\sim$ +0.4 volts). Q100 consequently turns off after excess minority carriers have been dissipated from within the base of Q100. Q15, which was not operating in saturation, turns off no later than Q100. Thus at this point in time all base current flow from or to Q16 is cut off. Q16 continues to conduct because of stored minority carriers within the base thereof. Because there is no minority carrier storage in a Schottky diode, D6 acts as an open circuit between Q15 and R7. The only way in which minority carriers stored in Q16 can be dissipated is through the process of recombination with majority carriers. Thus Q16 remains on and therefore current is continuously drawn from node 160 even after Q100 has turned off. Q110 now turns off since excess minority carriers are discharged from the bases thereof through R30. In the case of Q11 and Q14 of FIG. 1, Q11 had to turn off before Q14 could turn off. In the present situation, because of the current drain through R8 due to Q16 remaining on, Q140 begins to turn off at essentially the same time as Q110 and in fact does turn off at essentially the same time as Q110 or earlier.

The turnoff time of Q110 is essentially limited by R30 while the turnoff time of Q140 is limited essentially by the parallel combination of R40 and R8. Since R30 and R40 are designed to be relatively close in value, it is clear that the parallel combination of R40 with another resistor (R8) results in an equivalent resistance which is lower than that of R30. Accordingly, Q140 is able to discharge the minority carriers stored therein and turn off at least no later than the time that Q110 turns off. After Q110 turns off, Q120 and Q130 turn on and output terminal 140 is charged to within essentially one emitter base voltage level of VSS.

At this point in time the input can again be returned to the high level (+2.4 volts) and the process can be repeated.

The turnoff time of Q16 is adjusted by such fabrication techniques as gold doping so as to insure that the turnoff time, while greater than that of Q140, is not excessively greater.

As the input signal applied to terminal 12 increases to the high level (+2.4 volts) Q100 turns on and the potential of the base of Q110 rises and eventually reaches +1.4 volts. R30 and R40 are designed to be relatively close in value such that possible noise margin problems which occur when R40 is significantly lower in value than R30 are avoided. The circuitry illustrated in dashed line rectangle 11 of FIG. 2 lowers the effective value of R40 by providing a parallel low impedance path during the time it is necessary to discharge minority carriers from the base of Q140, and acts as an open circuit during the time that the input signal at 120 is rising to the high level. Thus the value of R40 is not reduced during the increases in potential of the base of Q110 and accordingly the emitter base junctions of Q110 and Q140 start out at essentially equal potentials and are maintained as such because the respective bases rise in value by essentially the same amount and at essentially the same rate.

Possible current spiking through the output transistors Q130 and Q140 can also occur when the input signal is pulsed to the high level, particularly if there is light capacitive load on output node 140. The emitter base junctions of Q110 and Q140 both are forward-biased and Q110 and Q140 both start to turn on. Node 140 and the collector of Q110 are both initially at approximately +VSS.

Parasitic capacitance essentially comprises the collector-to-substrate capacitance of Q110 and the capacitances associated with the base of Q120 and the anode of D30, which is associated with the collector terminal of Q110. Since both Q110 and Q140 are turning on, node 140 and the collector of Q110 both begin to drop in potential. It is possible with light capacitive loading on node 140 that Q140 will discharge node 140 faster than the collector node of Q110 discharges (drops in potential). This results in Q120 and Q130 having the emitter base junctions thereof forward-biased which in turn results in conduction through Q120 and Q130. Thus Q130 and Q140 could both conduct at the same time and large output currents can be created. However, at this point in time Q16 is also on. Q16 serves to divert current from Q110 which would otherwise serve as base drive current for Q140. This causes a reduction in the base drive to Q140 which slows down the rate of discharge of Q140 to the same or a slower rate than the discharge of the collector of Q110. This condition maintains a reverse bias on the emitter base junctions of Q120 and Q130 and therefore keeps Q120 and Q130 off. Thus during this time output current spiking through Q130 and Q140 cannot occur since Q130 is biased off.

In this case of light capacitive loading D30 and D50 play no active role since they are initially reverse-biased and since they remain so biased because the potential of the anode of D50 (node 140) is dropping more rapidly than that of the cathode of D30.

Normally the load capacitance coupled to terminal 140 is relatively large and node 140 discharges much more slowly than the collector of Q110. Thus Q120 and Q130 stay off even during the time the potential of the collector of Q110 is decreasing. When the collector potential of Q110 has dropped Q120 and Q130 are maintained biased off. In this case D50 and D30 are forward biased and provide excess base drive for Q140 which allows for the rapid discharge of the capacitive load coupled to output terminal 140.

The circuitry of FIG. 2 results in a level shifter which has good response time and in which output current spiking is essentially eliminated without the addition of complex circuitry or a substantial increase in power dissipation.

Figure 3:
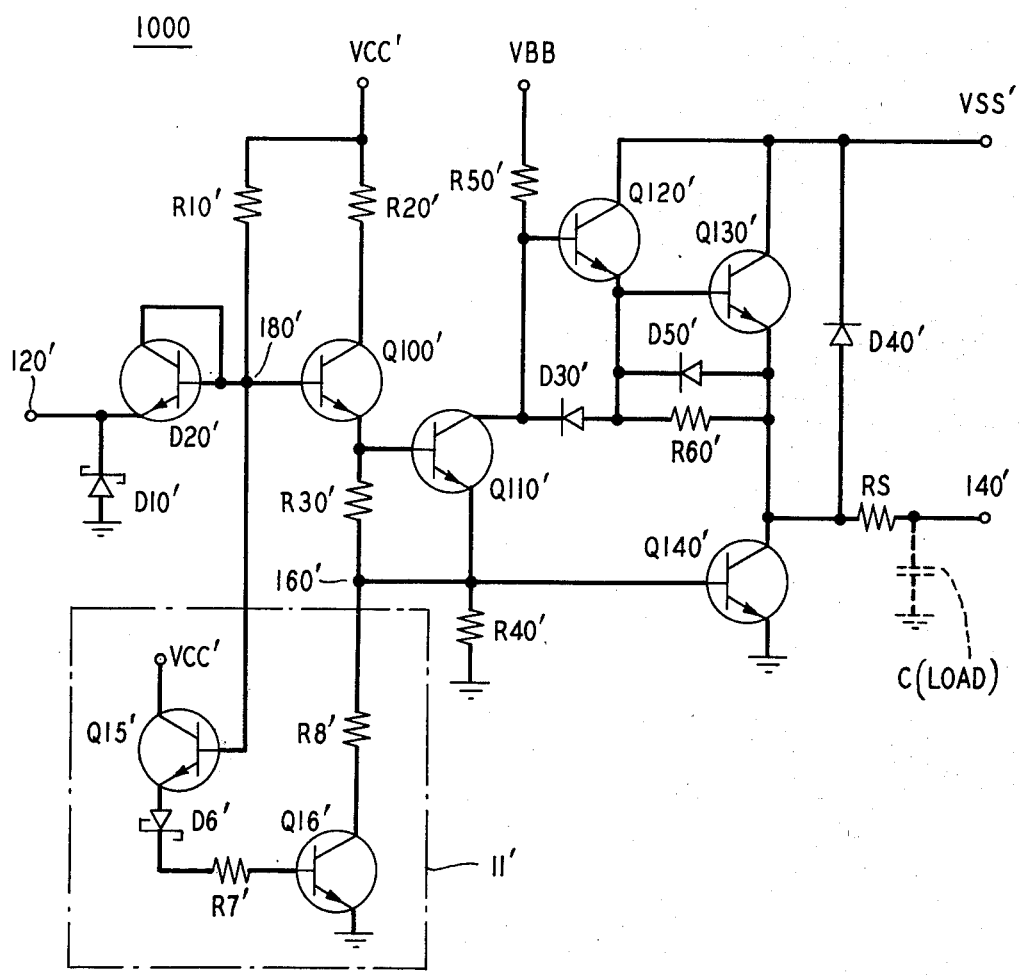
FIG. 3 illustrates another improved level shifter circuit in accordance with another embodiment of the present invention.

Referring now to FIG. 3, there is illustrated the preferred embodiment of a level shifter circuit 1000 which uses npn junction transistors. This configuration is essentially identical to the configuration of FIG. 2 except the input voltage clamping diode is a Schottky barrier diode D10′ instead of the standard p-n diode like D10, of FIG. 2, a series resistor RS is used in series with the output, and resistor R50′ is connected to a power supply VBB, whereas R50 of FIG. 2 is coupled to power supply VSS. All components of FIG. 3 which correspond to those like components of FIG. 2 use the same labels with a prime added.

The embodiment of FIG. 3 has been fabricated on a single integrated circuit chip. The values of resistors and power supplies utilized are as follows:
R10′ = 4000 Ohm
R20′ = 800 Ohm
R30′ = 350 Ohm
R40′ = 300 Ohm
R8′ = 200 Ohm
R7′ = 500 Ohm
R60′ = 800 Ohm
RS = 15 Ohm
VCC′ = +5 volts
VBB = 19.5 volts
VSS′ = 16.0 volts The use of power supply VBB (+19.5 volts) helps insure that the output voltage at terminal 140′ is +16 volts. The RS series output resistor helps damp out any inductive output ringing. The use of Schottky barrier diode D10′ clamps the input terminal 120 to within 0.5 volts of ground potential while a standard diode only clamps to within 0.7 volts of ground potential. Diode D20′ is a transistor with the collector and base connected together so as to act as a diode.

The circuit of FIG. 3 operates in substantially the same manner and has the same basic advantages as the configuration of FIG. 2.

The embodiments described herein are intended to be illustrative of the general embodiments of the invention. Various modifications are possible consistent with the spirit of the invention. For example, pnp transistors could be substituted for the npn transistor provided the polarities of the power supplies were adjusted accordingly. Still further the input circuitry which comprises a diode and a transistor could be easily modified as could the bias circuitry for the pull-up transistor.

What is claimed is:

1. A level shifter circuit comprising:
a first switching device comprising a control terminal and two output terminals;
a first junction saturation transistor comprising a base, an emitter and a collector, the collector of the first transistor being coupled to one of the output terminals of the first switching device;
a second saturation junction transistor comprising a base, an emitter and a collector, the emitter and collector of the second transistor being coupled to the base of the first transistor and the control terminal of the first switching device;
input circuit means having input and output terminals and being responsive to signals applied to the input terminal, the output terminal of the input circuit means being coupled to the base of the second transistor;
coupling circuit means characterized by at least one output terminal and only one input terminal;
a third saturation junction transistor comprising a base, an emitter and a collector, the collector of the third transistor being coupled to the base of the first transistor and the base of the third transistor being coupled to the input circuit means through the coupling circuit means; the emitters of the first and third transistors and the other terminal of the first switching device all being adapted to be coupled to appropriate power supply potentials.

2. The apparatus of claim 1 wherein the input circuit means comprises:
a fourth saturation transistor comprising a base, an emitter and a collector;
a first diode coupled by the cathode to the input terminal and coupled by the anode to the base of the fourth saturation junction transistor and to the first terminal of a first resistor;
a second resistor being coupled by the first terminal thereof to the collector of the fourth transistor; and
the emitter of the fourth transistor being coupled to the base of the second transistor.

3. The apparatus of claim 2 further comprises:
a third resistor connected to the base of the second transistor; and
a fourth resistor coupled between the emitter and base of the second transistor.

4. The apparatus of claim 3 wherein the collector of the second transistor is coupled to the control terminal of a second switching device having two output terminals, one of the output terminals of the second switching means being coupled to the control terminal of the first switching device.

5. The apparatus of claim 1 wherein the coupling circuit means comprises the series combination of a resistor, a Schottky barrier diode and a third switching means.

* * * * *